United States Patent [19]

Lee et al.

[11] Patent Number: 5,753,561
[45] Date of Patent: May 19, 1998

[54] METHOD FOR MAKING SHALLOW TRENCH ISOLATION STRUCTURE HAVING ROUNDED CORNERS

[75] Inventors: Henry C. Lee, San Francisco; Calvin T. Gabriel, Cupertino; Jie Zheng, Palo Alto, all of Calif.

[73] Assignee: VLSI Technology, Inc., San Jose, Calif.

[21] Appl. No.: 723,903

[22] Filed: Sep. 30, 1996

[51] Int. Cl.$^6$ ............................................. H01L 21/76
[52] U.S. Cl. ........................ 438/424; 438/701; 438/740
[58] Field of Search ............................ 438/424, 701, 438/740

[56] References Cited

U.S. PATENT DOCUMENTS

| | | |
|---|---|---|
| 3,977,925 | 8/1976 | Schwabe . |
| 5,023,197 | 6/1991 | Haond et al. . |
| 5,403,770 | 4/1995 | Jang . |
| 5,458,734 | 10/1995 | Tsukamoto . |
| 5,567,270 | 10/1996 | Liu . |

OTHER PUBLICATIONS

Andres Bryant, W. Haensch, S. Geissler, Jack Mandelman, D. Poindexter, and M. Steger, "The Current–Carrying Corner Inherent to Trench Isolation,"IBM Technology, Vermont and New York, IEEE Log #9211204, May 16, 1993.

Adler, DeBrosse, Geissler, Holmes, Jaffe, Johnson, Koburger, Lasky, Lloyd, Miles Nakos, Noble, Jr., Voldman, Armacost, and Ferguson, "The Evolution of IBM CMOS DRAM Technology,"vol. 39, No. 1/2, Journal of Research and Development, Oct. 14, 1994.

*Primary Examiner*—George R. Fourson
*Attorney, Agent, or Firm*—Hickman & Martine, LLP

[57] ABSTRACT

Disclosed is a method for making a shallow trench structure in a semiconductor substrate. The method includes: (a) forming a mask over a semiconductor substrate, the mask being provided with an aperture extending therethrough which exposes a region of the semiconductor substrate, the aperture having substantially vertical sidewalls; (b) depositing a blanket of silicon over the mask and within the aperture; (c) anisotropically etching the deposited silicon to form temporary spacers having curved profiles at the sidewalls of the aperture, the temporary spacers transferring the curved profiles to a mouth of a shallow trench being etched at the region of the semiconductor substrate as the temporary spacers are etched away; (d) whereby a shallow trench structure is formed where the mouth has a curved profile.

23 Claims, 6 Drawing Sheets

METHOD FOR MAKING SHALLOW TRENCH ISOLATION STRUCTURE HAVING ROUNDED CORNERS

BACKGROUND OF THE INVENTION

The present invention relates generally to isolation structures in semiconductor devices, and more particularly, to shallow trench isolation structures formed in semiconductor substrates.

Isolation structures are commonly implemented in semiconductor manufacturing in order to electrically isolate individual devices from one another. A well known isolation structure is a local oxidation of silicon (LOCOS) which is most commonly referred to as "field oxide regions." Typically, the field oxide regions are thermally grown within a nitride/oxide mask which is located between diffused active regions of adjacent devices. Once grown, a sufficient "barrier" results between the diffused active regions to prevent currents flowing through one device from leaking into a neighboring device. Although LOCOS isolation structures work well for devices having dimensions greater than about one micron, these structures are not well suited for semiconductor devices having dimensions less than about one micron.

By way of example, thermally grown field oxide regions typically introduce topographically raised regions which destructively interfere with subsequent fabrication steps such as photolithography. In addition, when field oxide regions are grown within a masked region, the field oxide region typically expands to fill the masked region. This expansion is carried even further when the grown oxide material expands the masking material laterally outward, thereby forming an isolation structure which is larger than the original masked region.

In an effort to develop physically smaller isolation structures that can be efficiently utilized in semiconductor devices having dimensions in the sub-micron regime, a shallow trench isolation (STI) structure was developed. In contrast with field oxide regions which are grown over a semiconductor surface, STI structures are generally defined within the semiconductor substrate. For example, once an oxide/nitride mask defines the location of the isolation structure, an etching process is implemented to etch away a trench into the semiconductor substrate.

Figure 1:
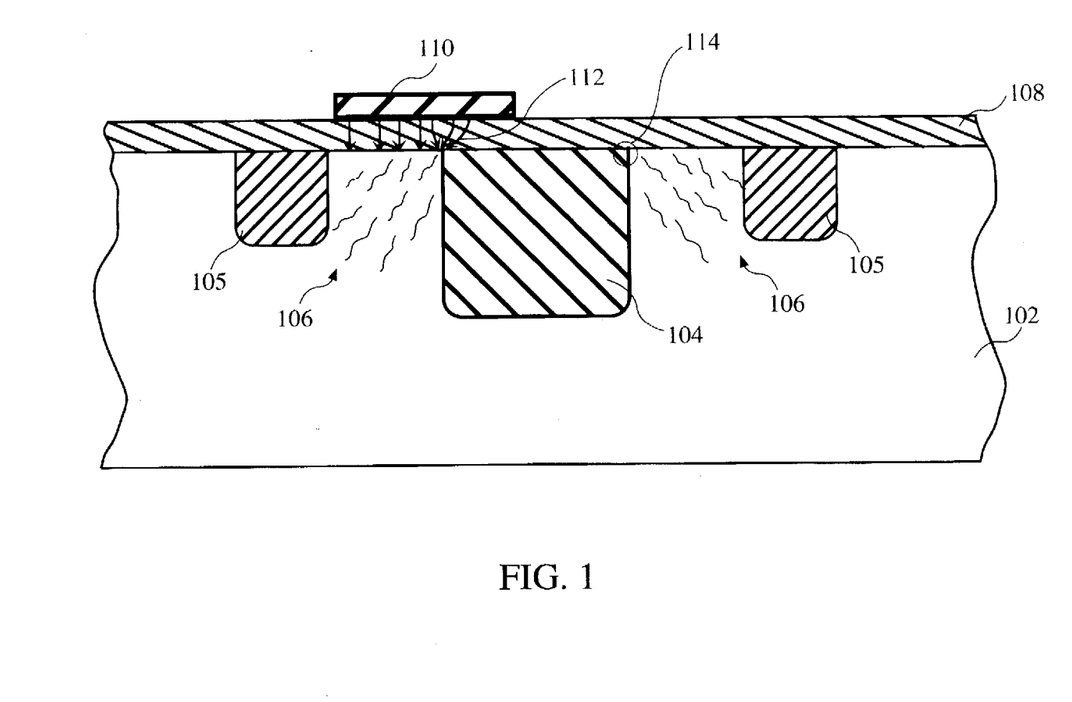
FIG. 1 is a cross-sectional view of a prior art shallow trench isolation structure formed within a silicon substrate.

FIG. 1 is a cross-sectional view of a prior art STI structure disposed within a silicon substrate 102 between a pair of diffusion regions 105. Generally, once a trench is etched into substrate 102, a silicon dioxide ($SiO_2$) 104 material is deposited into the trench until it is completely filled. After the silicon dioxide material has been deposited, a chemical mechanical polishing operation (CMP) is performed in order to remove any excess silicon dioxide material 104 remaining on the surface of substrate 102. As shown, the resulting trench has very sharp edges 114 where the surface of substrate 102 transitions into the silicon dioxide material 104. As is well known in the art, sharp edges 114 are a result of conventional trench formation.

During trench formation, an oxide/nitride mask is placed over a substrate area where an STI structure is desired, the resulting trench will typically be etched downward into substrate 102 where masking material is not present. When a reactive ion etching (RIE) process is performed, vertical walls defining the trench will result. At this point, sharp edges 114 have been defined, and will become even more apparent once the masking materials are removed. Unfortunately, sharp edges 114 introduce certain undesirable effects during subsequent processing steps which adversely impact on an integrated circuit's operation.

One problem that results from sharp edges 114 is "structural stresses" in the silicon structure of substrate 102 when subsequent layers are deposited over and into a previously defined trench. The structural stresses that occur in the silicon structure typically generate a number of dislocations 106 in the silicon crystal near and around sharp edges 114. Dislocations 106 usually migrate deeper into lower portions of the substrate during subsequent thermal processing steps (e.g., annealing). Unfortunately, as dislocations 106 migrate away from sharp edges 114, the dislocations form convenient paths for leakage currents. As a result, dislocations 106 can have the disadvantageous effect of providing an electrical conduction bridge that allows currents flowing through one device to "leak" into a neighboring device. If this happens, the isolation structure is typically rendered useless.

In further processing, a dielectric layer 108 is typically deposited over the planarized surface. As shown, a conductive pattern 110 is deposited and patterned over dielectric layer 108. For example, conductive pattern 110 may be a metallization line used to facilitate electrical interconnections between devices, or alternatively, a polysilicon line used in transistor gates. As illustrated, sharp edges 114 tend to intensify the electric fields in dielectric layer 108 which causes a bunching electric fields 112. The bunching of electric fields 112 has a disadvantageous effect of dominating on-currents in transistor gates. As a consequence, transistor performance will suffer since the transistor will tend to switch "on" at voltages which are lower than originally designed. Further, the bunching of electric fields 112 at underlying sharp edges 114 has been found to adversely impact the integrity of dielectric layer 108. When this happens, dielectric layer 108 may break down at lower voltages or after shorter times.

For more information on the disadvantageous effects associated sharp edges 114 in transistor devices, reference can be made to the following articles: (1) "The Current-Carrying Corner Inherent to Trench Isolation," by A. Bryant et al. IEEE Electron Device Letters, Vol. 14, No. 8, August 1993, and (2) "The Evolution of IBM CMOS DRAM technology," by E. Adler, et al., IBM CMOS Technology, Vol. 39, No. 1/2, June 1995. These references are hereby incorporated by reference.

In view of the foregoing, what is needed is STI structure and method for making an STI structure which reduces substrate dislocations, intense electric fields at underlying sharp edges, and leakage currents between neighboring semiconductor devices.

SUMMARY OF THE INVENTION

The present invention fills these needs by providing a method for making a shallow trench structure in a semiconductor substrate. The method includes: (a) forming a mask over a semiconductor substrate, the mask being provided with an aperture extending therethrough which exposes a region of the semiconductor substrate, the aperture having substantially vertical sidewalls; (b) depositing a blanket of silicon over the mask and within the aperture; (c) anisotropically etching the deposited silicon to form temporary spacers having curved profiles at the sidewalls of the aperture, the temporary spacers transferring the curved profiles to a mouth of a shallow trench being etched at the region of the semiconductor substrate as the temporary spacers are etched away; (d) whereby a shallow trench structure is formed where the mouth has a curved profile.

Advantageously, the curved profile that results at the mouth of the trench substantially reduces silicon structure dislocations caused by subsequent layer depositions over a shallow trench structure. Further, electric fields generated over the resulting curved shallow trench profiles are substantially less intense, and leakage currents between isolated neighboring devices are also lessened.

In another embodiment, a shallow trench structure is disclosed. The shallow trench structure is formed in a substrate having a planar surface. The shallow trench will have a width, a height, and a plurality of sidewalls, and the width is preferably greater than the height. The sidewalls are essentially planar and are essentially perpendicular to the surface, and the trench will preferably have a curved profile mouth opening into the substrate such that the mouth connects the substrate surface to the sidewalls.

Preferably, the curved profile is substantially outlined by rotating a vector having a magnitude of between about 65% and 95% of the height of said shallow trench multiplied by (√2). In this embodiment, the vector is defined along a hypotenuse of a square box having equal sides. In another embodiment, the curved profile is at least partially defined by a circle having a radius that has a dimension which is between about 10% and 50% of the height of said shallow trench. Advantageously, the curved profile reduces structural dislocations in the substrate, reduces intense electric fields caused by sharp edges and reduces leakage currents between adjacent devices.

These and other advantages of the present invention will become apparent upon reading the following detailed descriptions and studying the various figures of the drawings.

DETAILED DESCRIPTION OF THE PREFERRED EMBODIMENTS

FIG. 1 was previously described with reference to a prior art shallow trench structure. In particular, the disadvantages of having sharp edges at the mouth of a shallow trench were described.

The present invention is directed at a method of forming shallow trench isolation structures which exhibit substantially rounded profiles at the mouth of the trench. The method includes forming a mask over a semiconductor substrate where an isolation trench is desired. An aperture is then defined in the mask such that the aperture exposes a region of the semiconductor substrate. As a result, substantially vertical sidewalls are defined along the mask which extend down to the semiconductor substrate. A blanket of silicon is then deposited over the mask and within said aperture.

An anisotropic etching process follows where the deposited silicon is etched to form temporary spacers having curved profiles at the sidewalls of the aperture. As etching continues, the curved profiles of the temporary spacers are transferred to the mouth of a shallow trench which is defined in the semiconductor substrate. Advantageously, the resulting curved profile at the mouth of the shallow trench reduces structural stresses and dislocations within the silicon structure. In this manner, leakage currents between isolated diffused devices are reduced.

Figure 2A:
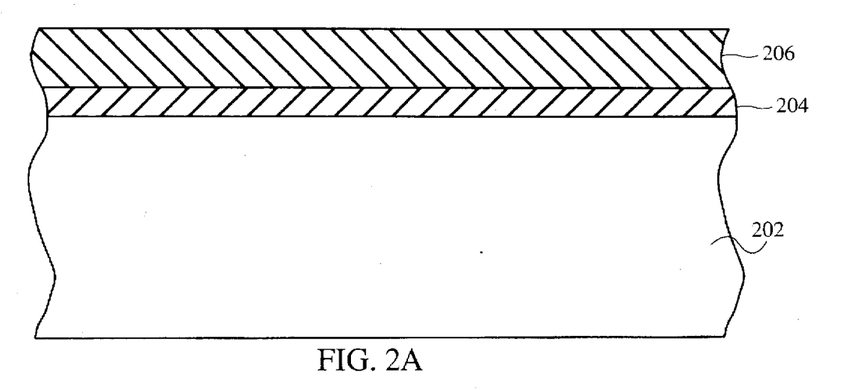
FIG. 2A is a cross-sectional view of a semiconductor substrate having masking layers formed thereon in accordance with a preferred embodiment of this invention.

FIG. 2A is a cross-sectional view of a partially fabricated semiconductor device. Typically, to form an isolation trench within a semiconductor substrate 202, an etching mask is formed over semiconductor substrate 202. Although any number of mask materials and layers can be used to define an etching mask, a two-layer mask is preferably deposited over semiconductor substrate 202. By way of example, a silicon dioxide ($SiO_2$) layer 204 will preferably be deposited to a thickness of between about 50 Å and about 1,000 Å, and more preferably between about 100 Å and 500 Å, and most preferably, about 200 Å.

Once silicon dioxide layer 204 has been deposited, a silicon nitride ($Si_3N_4$) layer 206 is blanket deposited over the silicon dioxide layer 204. In this embodiment, the thickness of silicon nitride layer 206 will preferably be between about 1,000 Å and 10,000 Å, and more preferably between about 2,000 Å and 5,000 Å, and most preferably, about 3,000 Å. At this stage, a masking structure having a suitable thickness is defined over semiconductor substrate 202.

Figure 2B:
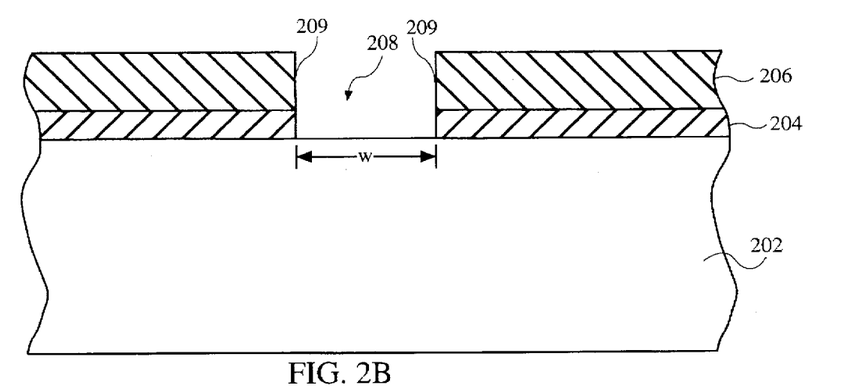
FIG. 2B is a semiconductor substrate having an aperture defined in the masking layers of FIG. 2A in accordance with a preferred embodiment of this invention.

FIG. 2B shows semiconductor substrate 202 after an aperture 208 is defined in silicon dioxide layer 204 and silicon nitride layer 206. Aperture 208 will preferably be defined using any suitable photolithography and etching process. By way of example, during photolithography, a resist film is spin coated over silicon nitride layer 206 and a reticle having a pattern identifying the location of aperture 208 is implemented. After light radiation is passed through the reticle, the exposed portions of resist are removed, and an etching step is performed to define aperture 208 in the masking material. Preferably, a dry plasma etching process is used to define aperture 208. However, in some embodiments, a wet isotropic etching process may be used. As illustrated, aperture 208 which results after the etching process has been completed, will have sidewalls 209 leading down to semiconductor substrate 202.

The width "W" of aperture 208 is preferably between about 1,000 Å and 20,000 Å, and more preferably between about 2,000 Å and 10,000 Å, and most preferably, about 4,000 Å. It should be understood that these aperture dimensions are merely exemplar for devices having sub-micron features (e.g., less than about one micron). In this manner, neighboring diffused regions are sufficiently isolated from one another during operation. Of course, the width "W" will also vary depending on the manner in which the trench is used. By way of example, if the trench is used to isolate a group of devices or functional circuit regions on a semiconductor substrate 202, isolation trenches can be one or more microns wide.

Figure 2C:
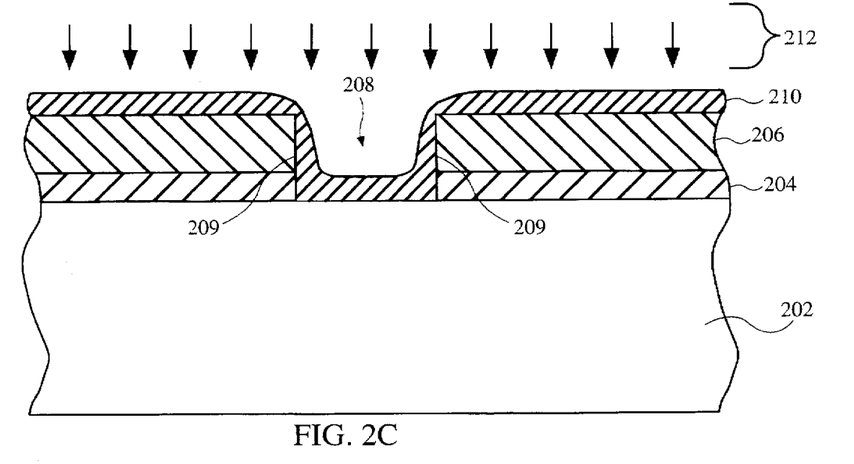
FIG. 2C shows the semiconductor substrate of FIG. 2B after a silicon layer has been deposited over the masking layers and the aperture is defined in accordance with a preferred embodiment of this invention.

FIG. 2C shows the masked semiconductor substrate 202 of FIG. 2B after a silicon layer 210 has been deposited over the masking material and in aperture 208 such that silicon layer 210 is direct contact with the exposed regions of semiconductor substrate 202. As shown, sidewalls 209 also retain a sufficient amount of silicon material. Typically, portions of silicon layer 210 which overlie the top corner regions of aperture 208 will have a thinner coating of silicon layer 210, and lower portions of sidewalls 209 will have a thicker coating of silicon layer 210. Consequently, silicon layer 210 which overlies sidewalls 209 will exhibit a curved profile.

In a preferred embodiment, silicon layer 210 can be any silicon-containing material such as polycrystalline silicon (polysilicon) and amorphous silicon (a-Si). By way of example, silicon layer 210 is preferably a material having an etch rate that is within about ten percent of the etch rate of pure silicon. In this manner, when silicon layer 210 is etched away during the formation of a trench in semiconductor substrate 202, silicon layer 210 will not prematurely etch away before the trench is defined in the semiconductor substrate 202.

In one embodiment, silicon layer 210 can be deposited using any number of chemical vapor deposition (CVD) processes. By way of example, a suitable CVD process is a low pressure chemical vapor deposition (LPCVD) process performed at a preferred temperature of between about 500° C. and 650° C., and more preferably at a temperature of about 620° C. The LPCVD process is further carried out at a preferred pressure of between about 100 mTorr and 400 mTorr, and more preferably at a pressure of about 350 mTorr. It should be apparent that the thickness of silicon layer 210 will depend upon the chosen width of aperture 208, to attain a trench which is wide enough to sufficiently isolate devices. By way of example, if the width of aperture 208 is reduced, the thickness of polysilicon layer 210 must also be reduced to avoid filling the void defined within aperture 208.

For the above described trench widths, the thickness of silicon layer 210 will be between about 1,000 Å and about 3,000 Å, and more preferably between about 1,500 Å and about 2,500 Å, and most preferably, about 2,000 Å. Silicon layer 210 will subsequently be subjected to an etching step where the curved profile of silicon layer 210 along side walls 209 is transferred into a trench defined in semiconductor substrate 202 which underlies aperture 208.

The etching process will preferably terminate at an "endpoint" indicative of when silicon layer 210 has been substantially removed from over the masking material and sidewalls 209 leaving a curved mouth trench. As will be described in greater detail below, the end-point at can be determined by monitoring the spectral emission of the plasma generated in the etching chamber, calculating the time required to etch away silicon layer 210 and generate a curved mouth trench, or a combination thereof.

Figure 2D:
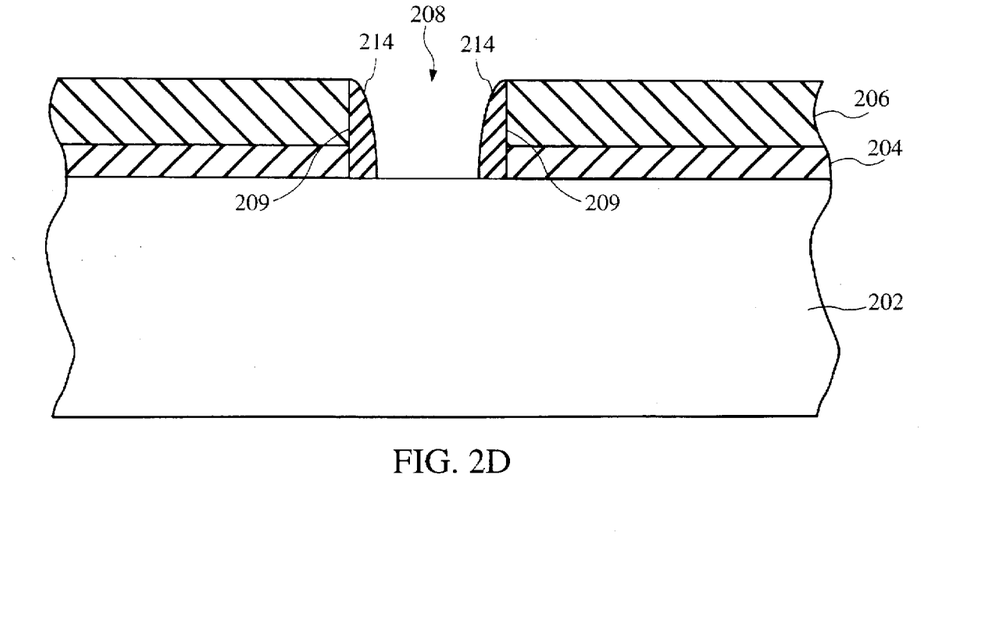
FIG. 2D shows a pair of temporary silicon spacers resulting during an etching process used to form a shallow trench structure in accordance with a preferred embodiment of this invention.

FIG. 2D shows a pair of silicon spacers 214 formed along sidewalls 209. It should be understood that silicon spacers 214 are formed after silicon layer 210 is etched away from the top surface of silicon nitride layer 206 and the exposed substrate surface area within aperture 208. Therefore, as etching continues, silicon spacers 214 will progressively be etched away while a curved trench is being defined in semiconductor substrate 202 within aperture 208. As apparent from FIG. 2D, silicon spacers 214 have a curved profile. That is, at the topmost region of sidewalls 209, the spaces are relatively thin, and progressively get thicker near the substrate surface (i.e., defining curved profile spacers). In a preferred embodiment, the average width of an individual spacer is preferably between about 1,000 Å and 3,000 Å, and most preferably, about 2,000 Å.

Although any well known etching apparatus may be used to etch silicon layer 210 and subsequently semiconductor substrate 202, a preferred etching apparatus is a Lam Research 4420 parallel plate etcher which is preferably powered up to between about 50 watts and 400 watts, and more preferably to between about 200 watts and 400 watts, and most preferably to about 300 watts.

In one embodiment, the pressure during etching is preferably set to between about 100 mTorr and 500 mTorr, and more preferably is set to between about 200 mTorr and 400 mTorr, and most preferably, is set to about 350 mTorr. Further, although any suitable etchant gas may be used, in one embodiment, $Cl_2$ and HBr gases are preferably used. Thus, the preferred flow rate of $Cl_2$ is preferably between about 50 sccm and 150 sccm, and more preferably between about 70 sccm and 110 sccm, and most preferably the flow rate of $Cl_2$ is about 90 sccm. The flow rate of HBr is preferably between about 10 sccm and 60 sccm, and more preferably between about 20 sccm and 40 sccm, and most preferably the flow rate of HBr is about 30 sccm. In addition, during etching, the bottom electrode of the parallel plate etcher is kept at a temperature of between about 40° C. and 80° C., and more preferably between about 50° C. and 70° C., and most preferably about 60° C.

Once the etcher has been powered up in accordance with the above described conditions, the etch rate of silicon layer 210 is preferably between about 20 Å per second and about 100 Å per second, and more preferably, between about 30 Å per second and about 60 Å per second, and most preferably, about 44 Å per second. The Lam Research 4420 parallel plate etcher of this example can be obtained from Lam Research Corporation of Fremont, Calif.

In a preferred embodiment, the end-point is determined by performing two etching operations. In a first etching operation, etching is performed until the silicon layer 210 lying over silicon nitride layer 206 and semiconductor substrate 202 is removed leaving the pair of silicon spacers 214. In this embodiment, it is possible to determine when silicon layer 210 has been removed from over silicon nitride layer 206 by monitoring the optical emission of the plasma in the etching chamber. By way of example, during etching, a peak optical emission is preferably monitored at a wavelength lying between about 400 nm and 410 nm, and more preferably, between about 403 nm and 407 nm, and most preferably about 405 nm. As a result, once silicon layer 210 has been removed from over silicon nitride 206, the monitored optical emission peak will fall indicating that silicon layer 210 has been essentially removed.

In the second etching operation, the pair of silicon spacers 214 and the semiconductor substrate 202 lying within the aperture are etched in accordance with a time-based etching process. By way of example, once the thickness of the pair of silicon spacers 214 is determined, etching is performed until the pair of silicon spacers are etched away leaving a trench in semiconductor substrate 202. Preferably, the etching time is determined by dividing the thickness of the pair of silicon spacers 214 by the etch rate. Once the spacers are removed, a curved profile trench is produced in the semiconductor substrate 202.

In another preferred embodiment, the end-point is detected by doping silicon layer 210 with impurities. By way of example, silicon layer 210 is preferably doped with n-type impurities such as Phosphorus (P+) and Arsenic (As+) in a p-type substrate, or p-type impurities such as Boron (B+) in an n-type substrate. The concentration level of the impurities will preferably be sufficient such that a plasma emission spectra will be produced and detected during etching. In this embodiment, silicon layer 210 will preferably have a dopant concentration of at least about $1\times10^{16}$ atoms/cm$^3$, and more preferably, at least about $1\times10^{17}$ atoms/cm$^3$, and most preferably at least about $1\times10^{20}$ atoms/cm$^3$ or greater.

Although silicon layer 210 can be doped in any number of ways such as, e.g., ion implantation, silicon layer 210 will preferably be deposited as a "doped" layer. This doping process is commonly referred to as an "in-situ" doping process, which means that the CVD chamber used during deposition is provided with a suitable amount of dopant gas during the deposition of silicon layer 210.

Accordingly, once silicon layer 210 has been deposited to an appropriate thickness, a plasma etch 212 is performed such that silicon layer 210 is initially removed over portions of the masking material layers 204 and 206, and the exposed region of semiconductor substrate 202 that lies within aperture 208.

Figure 2E:
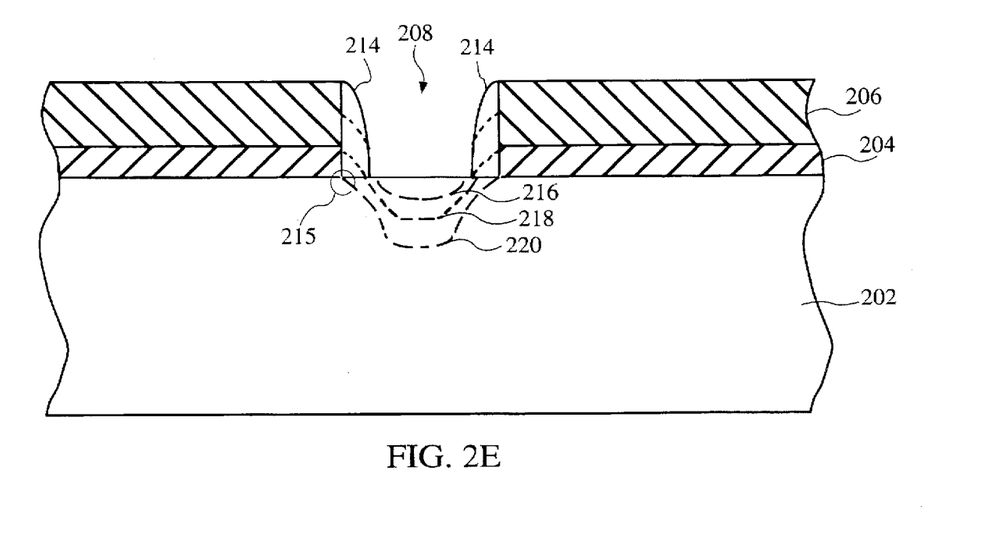
FIG. 2E shows the continuation of the shallow trench etching process which progressively forms a curved profile in the resulting trench in accordance with a preferred embodiment of this invention.

FIG. 2E shows the continuation of the shallow trench etching process 212. A plurality of dashed lines 216, 218 and 220 illustrate a progressively curved profile of the resulting trench which is induced by silicon spacers 214. By way of example, as etching progresses, a first dashed line 216 illustrates the etching profile generated when the top most portion of silicon spacer 214 is etched and a partial trench is defined in semiconductor substrate 202. A second dashed line 218 shows the etching profile generated as etching continues down silicon spacers 214 and into semiconductor substrate 202. Finally, a third dashed line 220 shows the curved etched profile resulting in semiconductor substrate 202 which defines a desired shallow trench. As can be appreciated, the curved profiles of silicon spacers 214 are substantially transferred to the mouth of the resulting shallow trench.

However, the etching process should terminate at about the same time silicon spacers 214 have been substantially etched away. Therefore, the end-point of etching is preferably identified by ascertaining the dopant level in the plasma emission spectra generated during the etching process. In this manner, the etching process will terminate at about the time that substantially all of the doped silicon layer 210 has been etched away. When doped silicon layer 210 is etched away, semiconductor substrate 202 will exhibit a shallow trench having a curved profile 215 at the mouth of the trench. The resulting trench will preferably be defined by dashed line 220 which represents the final depth of the shallow trench. As described above, the shallow trench is typically filled with a dielectric material to form an isolation structure before further processing is performed on semiconductor substrate 202.

Figure 3A:
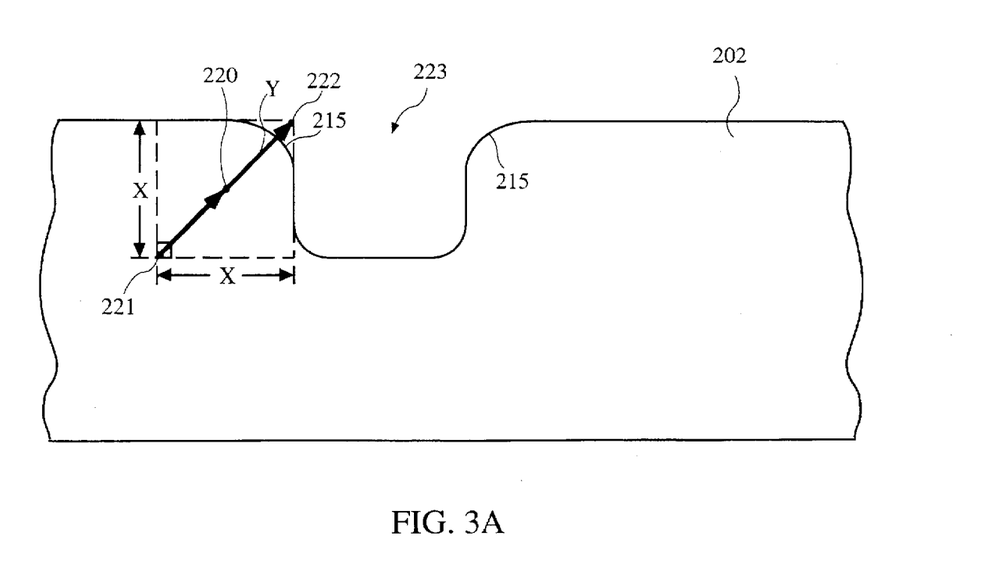
FIG. 3A defines the curved profile of the resulting shallow trench in accordance with a preferred embodiment of this invention.

FIG. 3A shows semiconductor substrate 202 after a shallow trench 223 having a curved profile mouth has been etched as described above. After shallow trench 223 has been defined, the masking layers 204 and 206 are removed. To better describe the characteristics of curved profiles 215, a dashed bounding box having equal lengths has been drawn along one of the curved profiles 215. In this embodiment, the length "X" of the bounding box will preferably be about the same as the depth of the resulting curved profile shallow trench 223. Since the bounding box has equal lengths "X," a hypotenuse "Y" will have a length of X multiplied by ($\sqrt{2}$). A vector can therefore be defined along hypotenuse Y which has a starting point at 221 and an ending point at 222.

The vector defined along hypotenuse Y will now be used to describe a preferred radius of curvature. By way of example, the focal point of the radius of curvature is point 221. In this manner, if the vector that is defined along hypotenuse Y is rotated about point 221, a curved profile is traced along the mouth of shallow trench 223. When the vector extends to 100% of the hypotenuse Y(e.g., between point 221 and point 222), no portion of semiconductor substrate 202 will be traced by the tip of the vector at point 222. That is, the traced profile extends beyond the trench region and substrate.

Alternatively, if the vector only extends to 50% of the hypotenuse (e.g., from point 221 to point 220), the curved profile traced by rotating the vector about point 221 will define a curved profile that is too far from shallow trench 223. Therefore, to define the curved profile, it would be desirable to have a vector which has a magnitude of between about 70% and 99.9% of the hypotenuse, and more preferably between about 90% and 99.5%, and most preferably about 96%. In this manner, when the vector is rotated about point 221, a curved profile is traced as shown by curved profiles 215 of shallow trench 223.

Figure 3B:
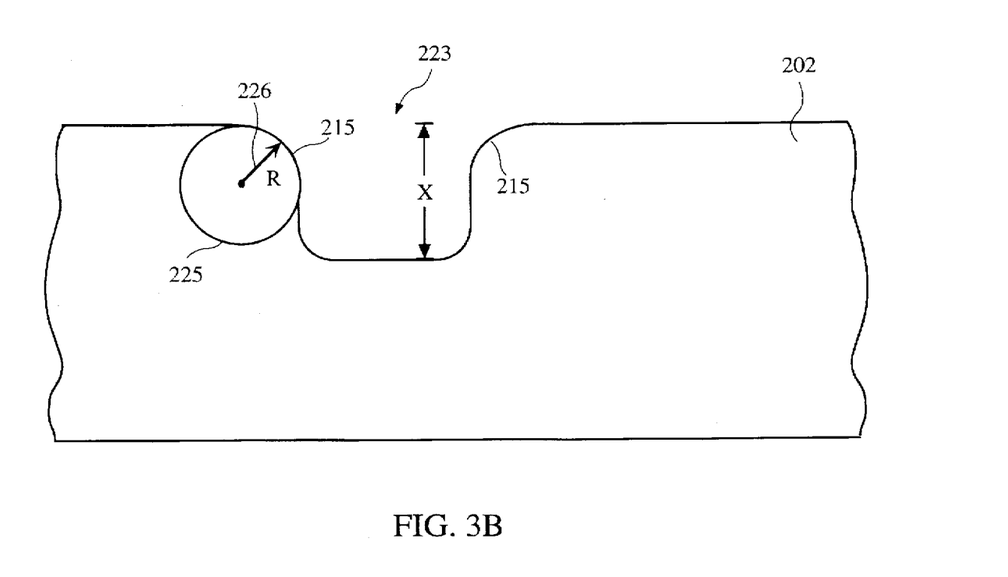
FIG. 3B defines the curved profile of the resulting shallow trench in accordance with another preferred embodiment of this invention.

To further appreciate the curved profiles of shallow trench 223, FIG. 3B shows semiconductor substrate 202 having a portion of a circle 225 super imposed along the edge of curved profile 215. As described above, the depth of shallow trench 223 is depicted by "X". Circle 225 is shown having a radius "R" 226 which defines the curvature at curved profiles 215. By way of example, as R 226 approaches zero, there will be no curved profile at the mouth of shallow trench 223. To achieve a good curvature, R 226 will preferably have a dimension which is between about 2% and 50% of the depth "X", and more preferably, between about 5% and 25%, and most preferably about 12.5%. In this manner, the curved profile defined at the mouth of shallow trench 223 is maintained in relation to semiconductor devices of varying dimensions which require shallow trench isolation structures.

Figure 4:
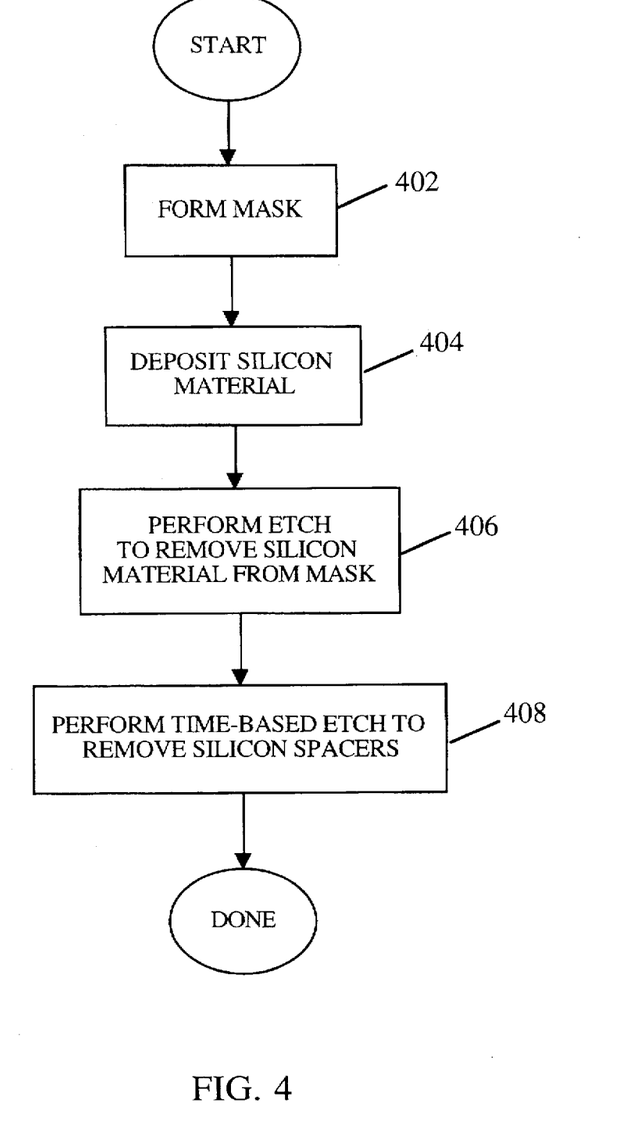
FIG. 4 is a flow chart illustration of a preferred method for forming a curved mouth shallow trench in accordance with one embodiment of this present invention.

FIG. 4 is a flow chart illustration of a preferred method for forming a curved mouth shallow trench in accordance with one embodiment of the present invention. The method starts at a block 402 where a mask is formed having an aperture over a semiconductor substrate requiring a shallow trench isolation structure. By way of example, suitable masking structures include an oxide/nitride stack which adequately protects portions of the semiconductor substrate which does not require an isolation structure. The aperture will preferably have substantially vertical sidewalls which extend from the top surface of masks and down to the bottom surface of the mask. In this manner, the sidewalls will extend down to an exposed region on the semiconductor substrate. Once the mask has been formed, the method proceeds to a block 404 where a silicon material (e.g., polysilicon, amorphous silicon, etc.) is blanket deposited over the masking material and within the aperture.

The method then proceeds to a block 406 where a first etching process begins. In the first etching process, etching is performed until the deposited silicon material lying over silicon nitride layer 206 and the exposed region of the semiconductor substrate is removed leaving silicon spacers. By monitoring the optical emissions of the plasma within the etching chamber at a "peak" wavelength, e.g., preferably between about 403 nm and 407 nm, it is possible to determine when the silicon material has been removed from over silicon nitride layer 206. Once the silicon material has been removed from over silicon nitride 206 and the exposed region of the semiconductor substrate, the peak at the monitored wavelength will fall indicating that the silicon material has been removed.

The method now proceeds to a block 408 where the silicon spacers and the exposed region of the semiconductor substrate are etched in accordance with a "time-based" etching process. By way of example, once the thickness of the silicon spacers is ascertained, etching is performed until the silicon spacers are etched away leaving a curved mouth trench within the exposed region of the semiconductor substrate. In this embodiment, the time required to reach the "end-point" of etching is determined by dividing the thickness of the silicon spacers by the etch rate. As the spacers are removed, a curved profile of the spacers is transferred to the mouth of the isolation trench structure.

Figure 5:
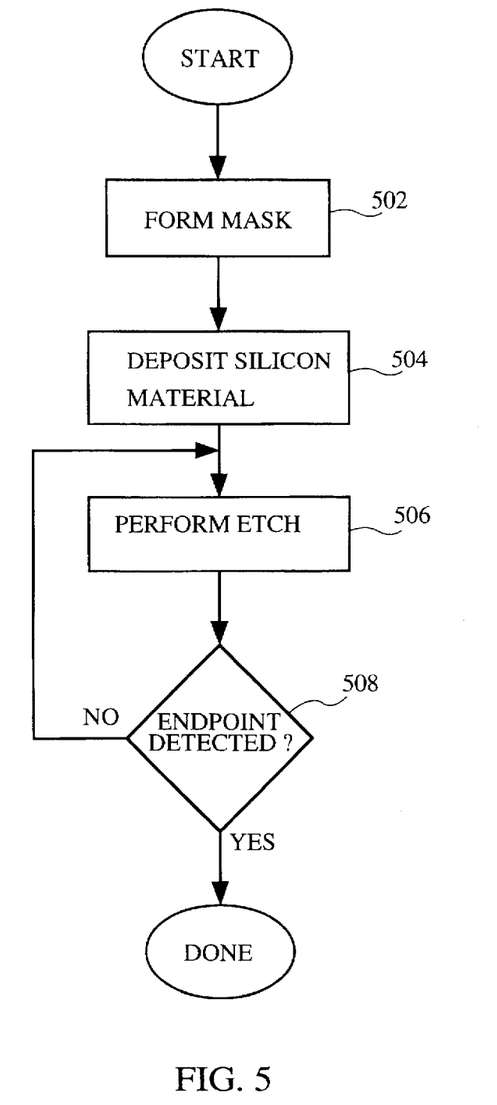
FIG. 5 is a flow chart illustration of a preferred method for forming a curved mouth shallow trench in accordance with another embodiment of this present invention.

FIG. 5 is a flow chart illustration of a preferred method for forming a curved mouth shallow trench in accordance with another embodiment of the present invention. The method starts at a block 502 where a mask is formed having an aperture over a semiconductor substrate requiring a shallow trench isolation structure. By way of example, suitable masking structures include an oxide/nitride stack which adequately protects portions of the semiconductor substrate which does not require an isolation structure. The aperture will preferably have substantially vertical sidewalls which extend from the top surface of masks and down to the bottom surface of the mask. In this manner, the sidewalls will extend down to an exposed region on the semiconductor substrate.

Once the mask has been formed, the method proceeds to a block 504 where a doped silicon material is blanket deposited over the masking material and within the aperture. Preferably the silicon material is a doped polysilicon layer which has an etch rate which is within about 10% of the etch rate of pure silicon. In this manner, a subsequently performed etching process will remove the doped polysilicon and portions of the semiconductor substrate lying within the mask aperture at approximately the same rate.

The method then proceeds to a block 506 where an etching process begins. Although any suitable anisotropic etching process will work, a parallel plate plasma etcher available from Lam Research Corporation is used to etch away the previously deposited doped polysilicon material. As etching progresses, the doped polysilicon material overlying the mask and exposed regions of the semiconductor substrate are removed. As described above, the remaining doped polysilicon material will lie along the sidewalls of the aperture. This material will therefore resemble a pair of spacers (e.g., silicon spacers 214 of FIG. 2D) which are temporarily formed and continually etched until their curved profile is transferred into the underlying semiconductor substrate.

While the plasma etching process is still in progress, the method proceeds to a decision block 508 where it is determined whether the end-point of the shallow trench etching process has been reached. By way of example, it is preferable that the etching process continue until the aforementioned spacers have been etched away. Once this happens, the end-point of etching has been reached. Therefore, while the etching process is in progress, the dopant level in the plasma emission spectra generated during etching is monitored. Consequently, if the plasma emission spectra indicates that the dopant level is not less than about $1 \times 10^{15}$ atoms/$cm^3$, the method will proceed back to block 506. Therefore, the etching process will continue while periodically checking whether the end-point has been reached at block 508.

When the dopant level detected in the plasma emission spectra is less than about $1 \times 10^{15}$ atoms/$cm^3$, the etching process will terminate. Since the dopant level in the plasma emission spectra is relatively low, this will signal that substantially all of the polysilicon spacers have been etched away from the sidewalls leaving a shallow trench structure. As a result, the curved profile of the polysilicon spacers will be transferred to the semiconductor substrate as shown in FIG. 2E. The final shallow trench structure will therefore have a curved profile at the mouth region as compared to sharp edges found in conventional shallow trench structures.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A method for making a shallow trench structure in a semiconductor substrate comprising:

forming a mask over a semiconductor substrate, said mask being provided with an aperture extending therethrough which exposes a region of said semiconductor substrate, said aperture having substantially vertical sidewalls;

depositing a blanket of silicon over said mask and within said aperture;

anisotropically etching said deposited silicon to form temporary spacers having curved profiles at said sidewalls of said aperture, said temporary spacers transferring said curved profiles to a mouth of a shallow trench being etched at said region of said semiconductor substrate as said temporary spacers are etched away;

whereby a shallow trench structure is formed where said mouth has a curved profile.

2. A method for making a shallow trench structure in a semiconductor substrate as recited in claim 1, wherein said deposited silicon is one of polysilicon and amorphous silicon.

3. A method for making a shallow trench structure in a semiconductor substrate as recited in claim 2, further comprising:

terminating said etching at about the time that said temporary spacers are etched away.

4. A method for making a shallow trench structure in a semiconductor substrate as recited in claim 3, wherein said terminating said etching is determined by end-point detection.

5. A method for making a shallow trench structure in a semiconductor substrate as recited in claim 4, wherein said end-point detection is based on monitoring a plasma emission spectra.

6. A method for making a shallow trench structure in a semiconductor substrate as recited in claim 5, wherein said deposited silicon is deposited as a doped silicon material having a dopant level of at least $1\times10^{16}$ atoms/cm$^3$, and wherein said end-point detection occurs when said dopant level in said plasma emission spectra indicates that substantially all of said doped silicon material has been etched away.

7. A method for making a shallow trench structure in a semiconductor substrate as recited in claim 6, wherein said dopant is selected from the group consisting of arsenic, phosphorous, and boron.

8. A method for making a shallow trench structure in a semiconductor substrate as recited in claim 1, wherein said anisotropic etching is performed in a first and second etching operation.

9. A method for making a shallow trench structure in a semiconductor substrate as recited in claim 8, wherein said first etching operation is performed until said deposited blanket of silicon lying over said mask and an exposed region of said semiconductor substrate is removed leaving said temporary spacers.

10. A method for making a shallow trench structure in a semiconductor substrate as recited in claim 9, wherein said first etching operation is terminated when a plasma emission spectra indicates the removal of said deposited blanket of silicon lying over said mask and an exposed region of said semiconductor substrate.

11. A method for making a shallow trench structure in a semiconductor substrate as recited in claim 8, wherein said second etching operation is a time-based etching operation indicating an end-point of etching at which said temporary spacers are removed from said sidewalls and said shallow trench structure having said curved profile is formed.

12. A method for making a shallow trench structure in a semiconductor substrate as recited in claim 11, wherein said time-based etching operation is determined based on a thickness of said temporary spacers and an etch rate of said deposited blanket of silicon.

13. A method for making a shallow trench structure in a semiconductor substrate comprising:

forming a multi-layer mask over a semiconductor substrate, said mask including a silicon-oxide layer and a silicon-nitride layer, said mask being provided with an aperture extending therethrough which exposes a region of said semiconductor substrate, said aperture having substantially vertical sidewalls;

depositing a blanket of silicon over said mask and within said aperture, said blanket of silicon comprising at least one of polysilicon and amorphous silicon;

anisotropically etching said blanket of silicon until about the time that it has been removed, where etching said blanket of silicon forms temporary spacers having curved profiles at said sidewalls of said aperture, said temporary spacers transferring said curved profiles to a mouth of a shallow trench being etched at said region of said semiconductor substrate as said temporary spacers are etched away;

whereby a shallow trench structure is formed where said mouth has a curved profile.

14. A method for making a shallow trench structure in a semiconductor substrate as recited in claim 13, further comprising:

terminating said etching at about the time that said temporary spacers are etched away.

15. A method for making a shallow trench structure in a semiconductor substrate as recited in claim 14, wherein said terminating said etching is determined by end-point detection.

16. A method for making a shallow trench structure in a semiconductor substrate as recited in claim 15, wherein said end-point detection is based upon plasma emission spectra.

17. A method for making a shallow trench structure in a semiconductor substrate as recited in claim 16, wherein said deposited silicon is deposited as a doped silicon material having a dopant level of at least $1\times10^{16}$ atoms/cm$^3$, and wherein said end-point detection occurs when said dopant level in said plasma emission spectra indicates that substantially all of said doped silicon material has been etched away.

18. A method for making a shallow trench structure in a semiconductor substrate as recited in claim 17, wherein said dopant is selected from the group consisting of arsenic, phosphorous, and boron.

19. A method for making a shallow trench structure in a semiconductor substrate as recited in claim 13, wherein said anisotropic etching is performed in a first and second etching operation.

20. A method for making a shallow trench structure in a semiconductor substrate as recited in claim 19, wherein said first etching operation is performed until said deposited blanket of silicon lying over said mask and an exposed region of said semiconductor substrate is removed leaving said temporary spacers.

21. A method for making a shallow trench structure in a semiconductor substrate as recited in claim 20, wherein said first etching operation is terminated when a plasma emission spectra indicates the removal of said deposited blanket of silicon lying over said mask and an exposed region of said semiconductor substrate.

22. A method for making a shallow trench structure in a semiconductor substrate as recited in claim 19, wherein said second etching operation is a time-based etching operation indicating an end-point of etching at which said temporary spacers are removed from said sidewalls and said shallow trench structure having said curved profile is formed.

23. A method for making a shallow trench structure in a semiconductor substrate as recited in claim 22, wherein said time-based etching operation is determined based on a thickness of said temporary spacers and an etch rate of said deposited blanket of silicon.

* * * * *